United States Patent
Kao et al.

(10) Patent No.: US 7,338,853 B2
(45) Date of Patent: Mar. 4, 2008

(54) HIGH POWER RADIO FREQUENCY INTEGRATED CIRCUIT CAPABLE OF IMPEDING PARASITIC CURRENT LOSS

(75) Inventors: Jung-Cheng Kao, Shanghai (CN); David Day-Yee Lin, Shanghai (CN)

(73) Assignee: Grace Semiconductor Manufacturing Corporation, Shanghai (CN)

( * ) Notice: Subject to any disclaimer, the term of this patent is extended or adjusted under 35 U.S.C. 154(b) by 98 days.

(21) Appl. No.: 11/335,758

(22) Filed: Jan. 20, 2006

(65) Prior Publication Data

US 2006/0118906 A1 Jun. 8, 2006

Related U.S. Application Data

(62) Division of application No. 10/922,981, filed on Aug. 23, 2004.

(30) Foreign Application Priority Data

Sep. 1, 2003 (CN) ................. 03 1 50711

(51) Int. Cl.
*H01L 21/8234* (2006.01)
(52) U.S. Cl. ................. 438/238; 257/E21.503; 257/E21.597
(58) Field of Classification Search ......... 438/238; 257/531, E21.597, E21.503
See application file for complete search history.

(56) References Cited

U.S. PATENT DOCUMENTS

| 5,593,922 | A * | 1/1997 | Liaw et al. ............. 438/9 |
| 6,258,651 | B1 * | 7/2001 | Jenq et al. ............. 438/238 |
| 6,265,302 | B1 * | 7/2001 | Lim et al. ............. 438/622 |
| 6,358,820 | B1 * | 3/2002 | Maeda ............. 438/459 |
| 6,759,272 | B2 * | 7/2004 | Tsubosaki et al. ........ 438/109 |
| 2001/0028936 | A1 * | 10/2001 | Nishiyama et al. ....... 428/64.3 |
| 2005/0136568 | A1 * | 6/2005 | Fukazawa ............. 438/106 |

\* cited by examiner

*Primary Examiner*—Michael Lebentritt
*Assistant Examiner*—Thu-Huong Dinh
(74) *Attorney, Agent, or Firm*—Rosenberg, Klein & Lee

(57) ABSTRACT

A high power RF IC capable of impeding parasitic current loss and method of manufacturing the same. First a step of semiconductor front-side processing for the high power RF components that includes inductive components is performed. Afterwards, the backside of semiconductor base is polished to a certain thickness, and then lithography and etching processes is employed for forming a backside trench contact window. A backside deposition for oxide insulation layer can be performed so that the oxide insulation layer can be located in the semiconductor base right under the inductive components for impeding the parasitic current loss generated by the inductive components in the semiconductor base due to electromagnetic induction. Therefore, performance of the inductive components operating in high frequency can be improved.

8 Claims, 5 Drawing Sheets

US 7,338,853 B2

HIGH POWER RADIO FREQUENCY INTEGRATED CIRCUIT CAPABLE OF IMPEDING PARASITIC CURRENT LOSS

This application is a Divisional patent application of co-pending application Ser. No. 10/922,981, filed on 23 Aug. 2004.

FIELD OF THE INVENTION

The present invention relates to a high power RF IC and, more particularly, to a high power RF IC that can impede parasitic current loss generated by built-in inductive components and method of manufacturing the same.

BACKGROUND OF THE INVENTION

Nowadays RF IC components are widely applied to various wireless communication apparatuses. To keep pace with the rapid growth of wireless communication, the RF semiconductor industry has to constantly update its techniques promptly. Therefore, an upgraded wireless communication apparatus has to be designed with more complicated structure to meet the demand of better functionality. For this reason, power of RF components has to be improved to meet more sophisticated applications of wireless communication.

A sectional diagram of a conventional silicon chip with built-in inductive component is shown in FIG. 1, which forms active components with a field oxide transistor on a silicon base 10. The active components include a field oxide layer 12, a gate oxide layer 14, a polysilicon layer 16, a gate spacer 18, and a source/drain region 20. After formation of the active components, a silicon dioxide dielectric layer 22 is deposited on the silicon base 10. Then, an inductive component 24 is built in at a location right above the field oxide layer 12 of the silicon base 10. The inductive component 24 contains a multiple-layered inductive coil 242, and each layer of the inductive coil 242 is electrically insulated from one another by the dielectric layer 244 while electrically connected to one another by the plug 246.

However, the built-in inductive component 24 can cause parasitic current loss at the silicon base 10 in a direction along the axial direction of the inductive coil 242 due to electromagnetic induction. This phenomenon can cause a loss or decline in the Q factor for the inductive component 24 and therefore affect performance of inductive component 24 during high frequency and high power operation. In other words, performance of the inductive component 24 can deteriorate significantly.

In view of the aforementioned problems, the present invention provides a high power RF IC capable of impeding parasitic current loss and a method of manufacturing the same so as to solve the problems.

SUMMARY OF THE INVENTION

An object of the present invention is to provide a high power RF IC and method of manufacturing the same, which forms an oxide insulation layer under the inductive components so that the semiconductor base located under the inductive components can be thoroughly insulated to effectively impede parasitic current loss generated by the inductive components in the semiconductor base due to electromagnetic induction.

Another object of the present invention is to provide a high power RF IC capable of impeding parasitic current loss and method of manufacturing the same, which avoids a decline in the Q factor of the inductive component so that performance of inductive components can be improved when operating in high frequency.

To achieve the aforementioned objects, the structure of the high power RF IC of the present invention provides a semiconductor base with a plurality of active components and a plurality of isolation structures for isolating the active components. The at least one dielectric layer is located on the semiconductor base for covering the active components and the isolation structures. A plurality of inductive components is provided on the surface of dielectric layer located above the isolation structures. A trench insulation layer is provided in the semiconductor base under the inductive components so that the trench insulation layer can be directly connected to the isolation structures.

Another aspect of the present invention is to provide a manufacturing method for the aforementioned structure of high power RF IC, which includes the following steps: the first step is to sequentially form isolation structures, active components and dielectric layers on the semiconductor base and also form a plurality of inductive components on the surface of dielectric layer located above the isolation structures. The second step is to form a protection layer on the semiconductor base for covering and protecting the above-mentioned components. The third step is to employ lithography and etching techniques after the back of semiconductor base is polished to a certain thickness for forming a patterned resist layer on the back of semiconductor base. The fourth step is to use the patterned resist layer as a mask for etching the back of semiconductor base until the isolation structure is reached, and then a trench contact window is formed. The fifth step is to remove the patterned resist layer after the previous step is finished. The final step is to perform vapor deposition and planarization for the insulation layer in the trench contact window for forming a trench insulation layer so that the trench insulation layer is directly connected to the isolation structures and is located right under the inductive components.

The objects, technical contents, and features of the present invention will be better understood through descriptions of the following embodiment with reference to the drawings.

DETAILED DESCRIPTION OF THE PREFERRED EMBODIMENTS

The high power RF IC components of the present invention impede parasitic current loss generated by the built-in inductive components in the semiconductor base through a simple method that employs a trench insulation layer.

Figure 1:
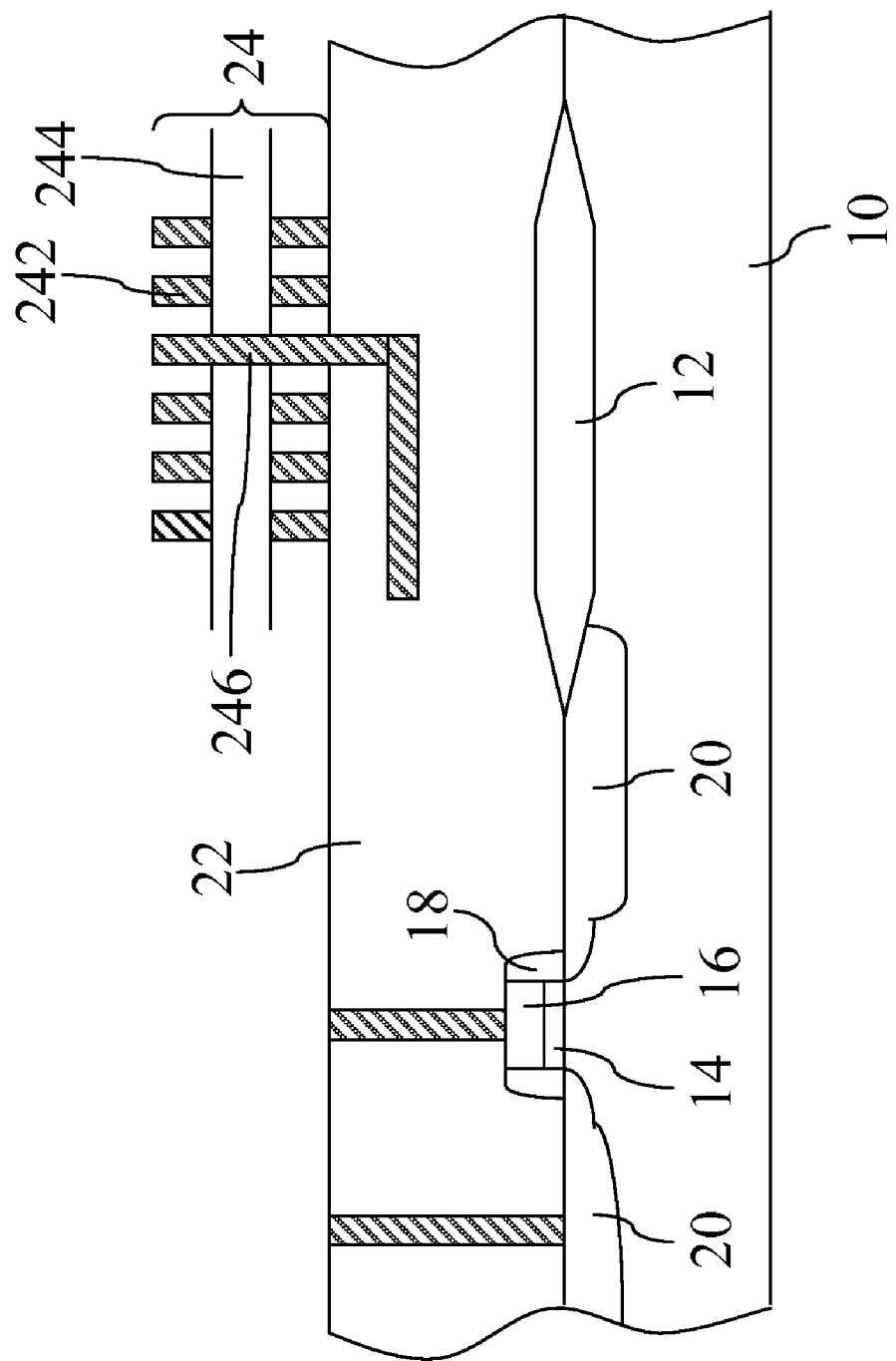
FIG. 1 is a sectional diagram illustrating the structure of a conventional silicon chip with built-in inductive components.
Figure 2:
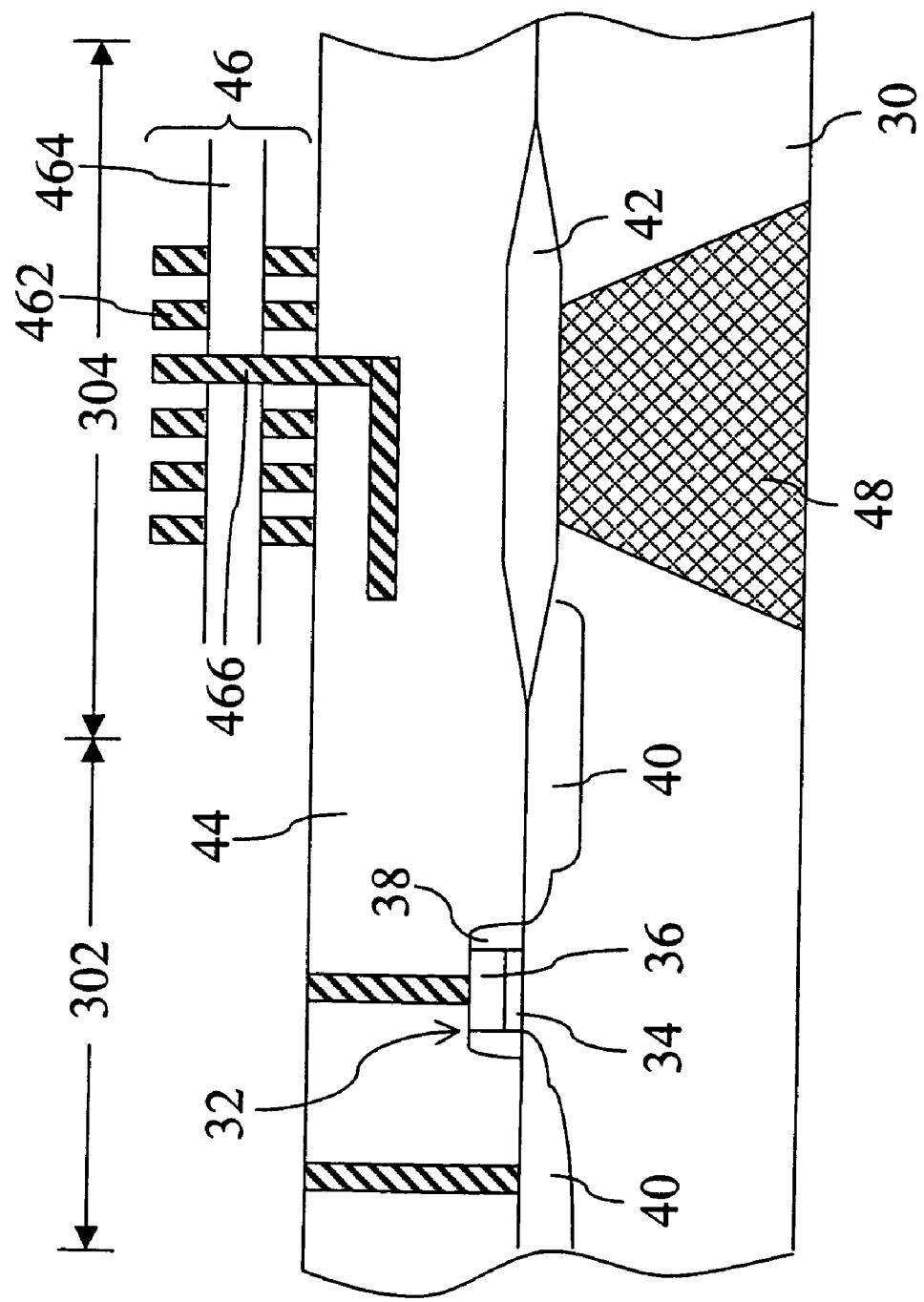
FIG. 2 is a sectional diagram illustrating the structure of RF IC components with built-in inductive components according to the present invention.

FIG. 2 is a sectional diagram illustrating the structure of RF IC components with built-in inductive components according to the present invention. As shown in FIG. 2, a semiconductor base 30 is provided, which is usually a silicon chip comprising an active region 302 and an isolation region 304 thereon. Also, a plurality of active components 32 is provided in the active region 32, wherein the active component 32 is a structure of field oxide transistor formed by gate oxide layer 34, polysilicon layer 36, gate spacer 38, and source/drain region 40. Alternatively, the active component 32 can be bipolar transistor or a combination of two kinds of transistor. Also, a field oxide isolation structure 42 is provided in the isolation region 304 on the semiconductor base 30, as shown in FIG. 2, for isolating the active components 32, wherein the field oxide isolation structure 42 can also be a shallow trench isolation structure.

Next, a dielectric layer 44 is formed by deposition at a location above the active region 302 and isolation region 304 on the semiconductor base 30. The material of dielectric layer 44 can be planarized silicon dioxide or other low K materials so that the dielectric layer 44 can cover the active component 32 and field oxide isolation structure 42. In addition, a plurality of inductive components 46 is formed on the surface of dielectric layer 44 above the field oxide isolation structure 42. The inductive component 46 consists of encircled multi-layered inductive coil 462. Each layer of inductive coil 462 is electrically insulated from one another by means of a dielectric layer 464 while electrically connected to one another by means of a plug 466. Also, the dielectric layer 44 is employed to insulate the active region 302 and isolation region 304 located under the inductive coil 462 as well as the inductive component 46 located above the inductive coil 462. Finally, a trench insulation layer 48 is formed in the semiconductor base 30 under the inductive component 46 so that the trench insulation layer 48 can be directly connected to the field oxide isolation structure 42. The material of trench insulation layer 48 can be silicon oxide, silicon nitride, or other chemical deposition insulating materials.

Figure 3A:
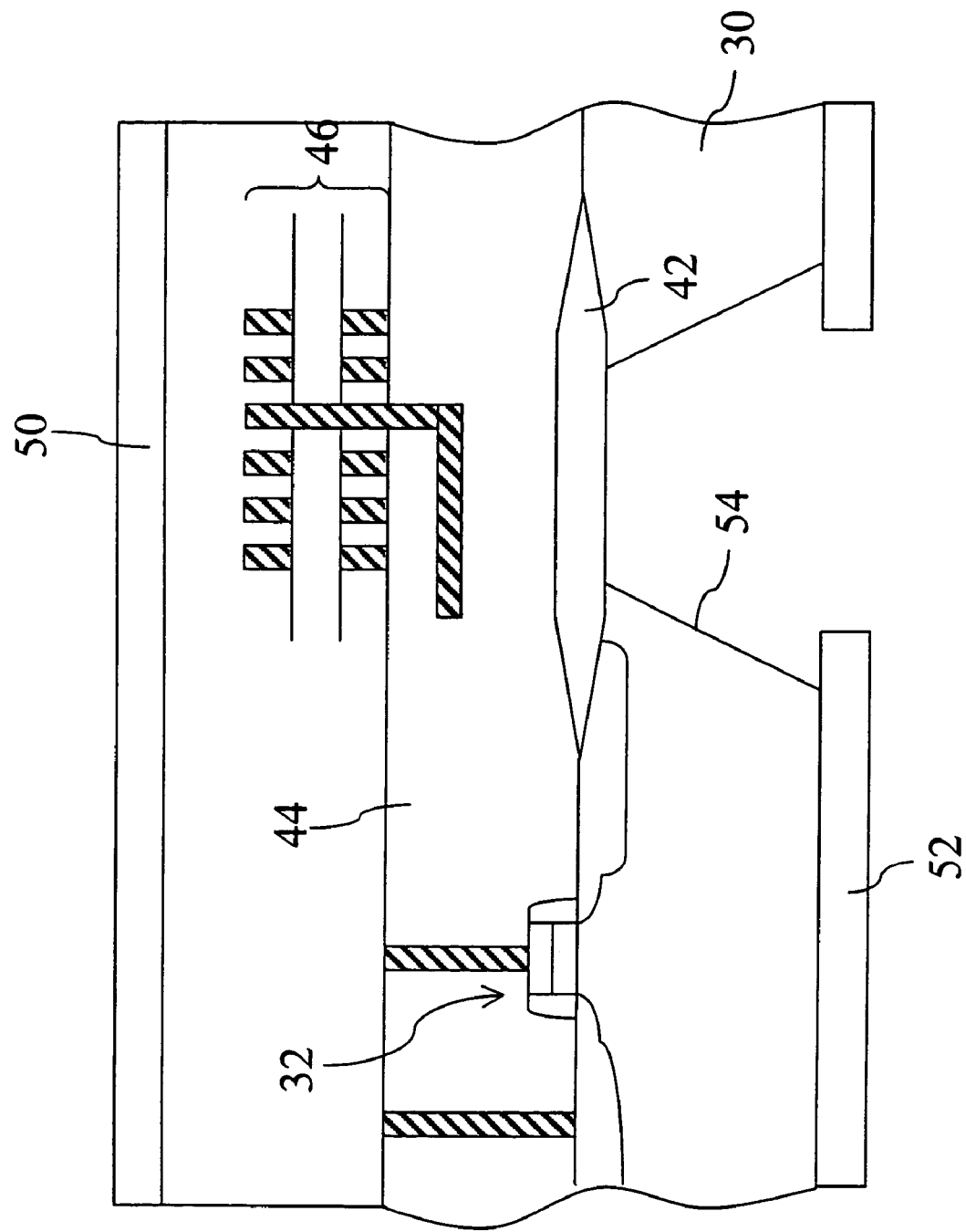
FIGS. 3(a) and 3(b) are sectional diagrams illustrating the structure of processing the back of semiconductor base according to the present invention.
Figure 3B:
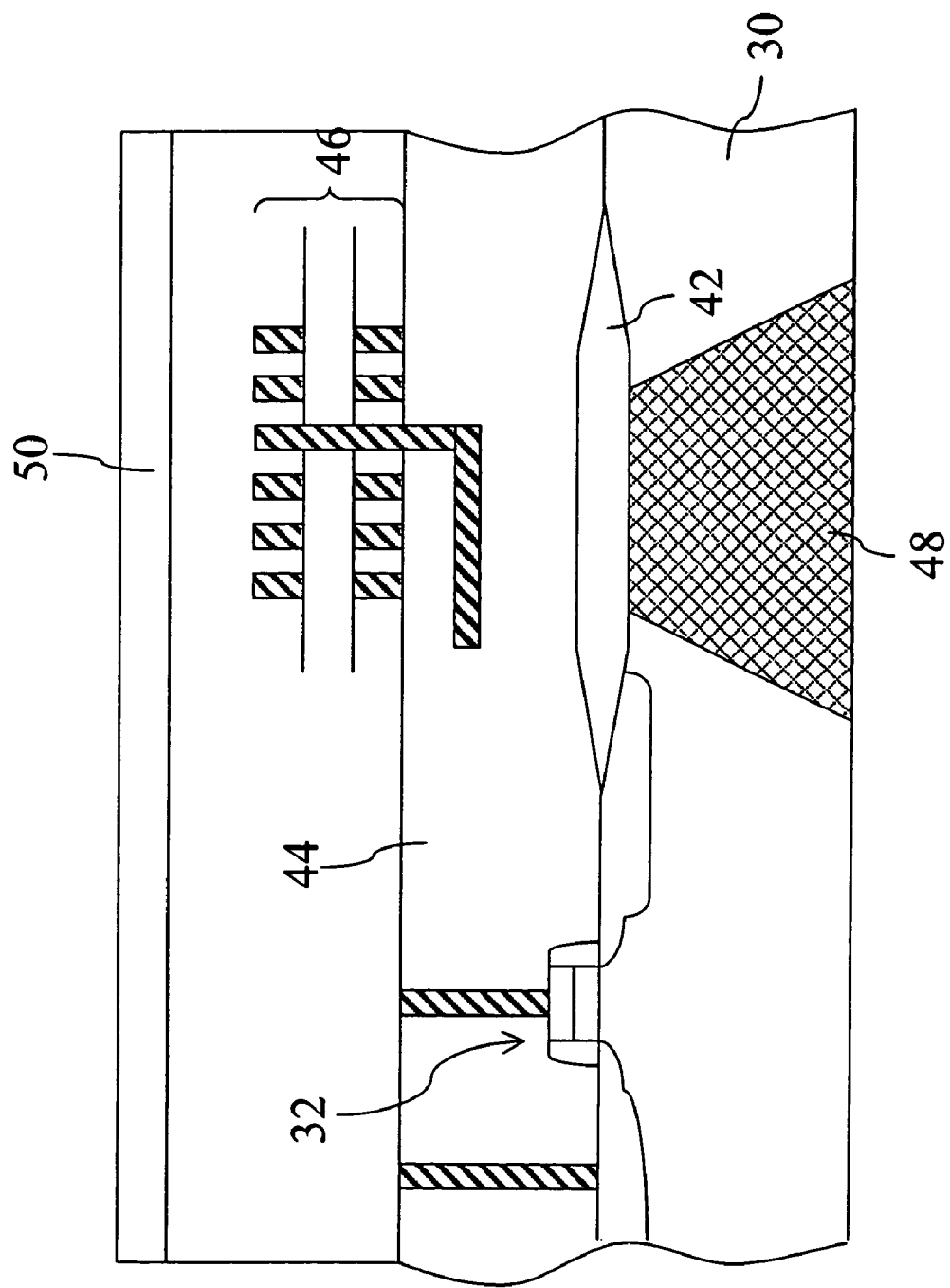

After front-end processing for the high power RF IC components, including formations of the field oxide isolation structure 42, the active components 32, the dielectric layer 44, and the inductive component 46 is completed, there is usually one more procedure to be done, which is the back polishing process. But before the back polishing, a protection layer 50 has to be formed on the semiconductor base 30, as shown in FIG. 3(a), and by doing so, the protection layer 50 can cover each of the aforementioned components to prevent each component on the surface of semiconductor base 30 from damage. After that, the back of semiconductor base 30 will be polished to a certain thickness, which is approximately 100 microns, and then lithography and etching techniques can be applied to form a patterned resist layer 52 on the back of semiconductor base 30. Then, the patterned resist layer 52 will be used as a mask to etch the back of semiconductor base 30 until the field oxide isolation structure 42 is reached. Through the etching process, a trench contact window 54 can be formed, and after formation, the patterned resist layer 52 will be removed. Next, referring to FIG. 3(b), the process of vapor deposition and planarization for the insulation layer will be executed in the trench contact window 54, which includes the following steps. First, chemical vapor deposition will be employed, wherein the deposition comprises silicon oxide, silicon nitride, or other chemical deposition insulating materials, and then the deposition will be stocked in the trench contact window 54. Next, chemical dry etching or chemical mechanical polishing will be applied for planarization until the deposited insulating material fill the trench contact window 54 under the inductive component 46 for forming a trench insulation layer 48. Also, the trench insulation layer 48 is directly connected to the field oxide isolation structure 42 as well as located right under the inductive components 46.

The invention provides a trench insulation layer in the semiconductor base right under the inductive components and the field oxide isolation structure so that nonconductive insulation can be thoroughly formed in the semiconductor base right under the inductive components for impeding parasitic current loss generated by the semiconductor base due to electromagnetic induction. In addition to that, decrease in the Q factor of inductive components can also be avoided and thus enhance performance of inductive components when operating in high frequency.

Figure 4:
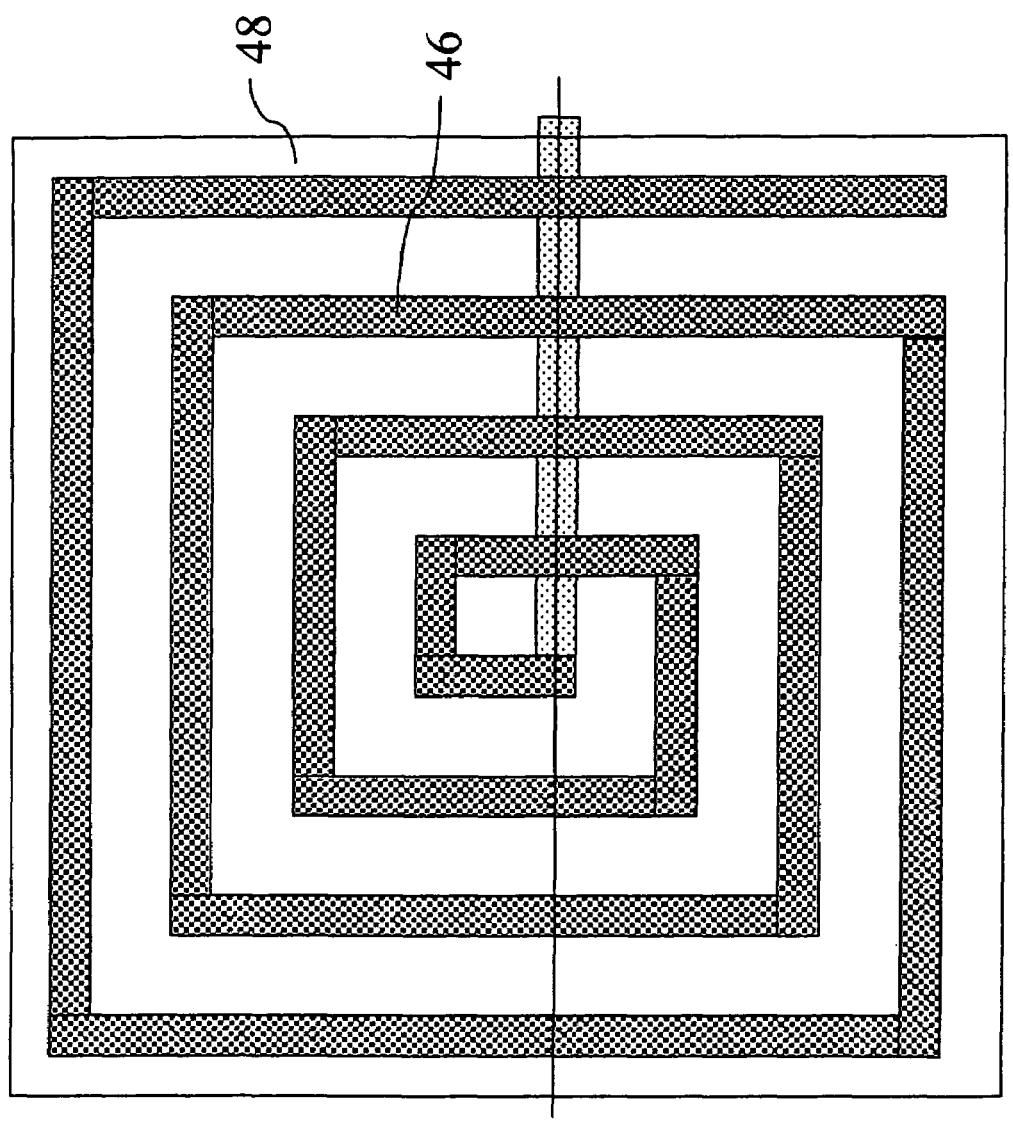
FIG. 4 is a top view of the structure of RF IC components with built-in inductive components according to the present invention.

FIG. 4 is a top view of the structure of RF IC components with built-in inductive components according to one embodiment of the present invention. As shown in FIG. 4, the trench insulation layer 48 located under the inductive component 46 in the semiconductor base 30 as well as connected to the location under the field oxide isolation structure 42 can effectively impede parasitic current loss in a horizontal axis direction generated by the inductive components 46 due to electromagnetic induction.

The embodiment above is only intended to illustrate the present invention; it does not, however, to limit the present invention to the specific embodiment. Accordingly, various modifications and changes may be made without departing from the spirit and scope of the present invention as described in the following claims.

What is claimed is:

1. A manufacturing method of high power RF IC capable of impeding parasitic current loss comprising:
   providing a semiconductor base having an active region and an isolation region displaced from the active region;
   forming a field oxide region in said isolation region of the semiconductor base, active components in the active region, and a first dielectric layer formed over the active components, the field oxide region and the semiconductor base;
   forming a plurality of inductive components on the first dielectric layer above the field oxide region and overlaying the first dielectric layer and inductive components with a second dielectric layer;
   forming a protection layer on the second dielectric layer;
   polishing a back surface of the semiconductor base to a thickness approximating 100 microns;
   forming a patterned resist layer on the polished back surface of the semiconductor base;
   using the patterned resist layer as a mask to etch the back surface of the semiconductor base until the field oxide region is reached to define a trench contact window therein, and then subsequently removing the patterned resist layer; and
   vapor depositing an insulating layer within the trench contact window formed in the semiconductor base and planarization of the insulation layer in the contact window to form a trench insulation layer that is directly connected to the field oxide region to be located directly under the inductive component.

2. The manufacturing method of high power RF IC capable of impeding parasitic current loss as claimed in claim 1, wherein the active component comprises a field oxide transistor, bipolar transistor, or a combination of two kinds of transistor.

3. The manufacturing method of high power RF IC capable of impeding parasitic current loss as claimed in claim 1, wherein the active component is formed by a structure of transistor component comprising a gate oxide layer, a polysilicon layer, a gate spacer, and a source/drain region.

4. The manufacturing method of high power RF IC capable of impeding parasitic current loss as claimed in claim 1, wherein material of the first dielectric layer is made of silicon dioxide or other low K materials.

5. The manufacturing method of high power RF IC capable of impeding parasitic current loss as claimed in claim 1, wherein the inductive component comprises a multi-layered inductive coil, and each layer of the inductive coil is electrically insulated from one another by the first dielectric layer while being electrically connected to one another by a plug.

6. The manufacturing method of high power RF IC capable of impeding parasitic current loss as claimed in claim 1, wherein material of the trench insulation layer is selected from silicon oxide, silicon nitride, and other chemical deposition insulating materials.

7. The manufacturing method of high power RF IC capable of impeding parasitic current loss as claimed in claim 1, wherein the planarization processing for the trench insulation layer employs chemical dry etching or chemical mechanical polishing for thorough processing.

8. The manufacturing method of high power RF IC capable of impeding parasitic current loss as claimed in claim 1, wherein the step of vapor depositing the insulation layer includes the step of chemical vapor depositing the insulation layer.

* * * * *